US005140285A

United States Patent [19]

Cohen

[11] Patent Number: 5,140,285

[45] Date of Patent: Aug. 18, 1992

[54] Q ENHANCED DIELECTRIC RESONATOR CIRCUIT

[75] Inventor: Leonard D. Cohen, Brooklyn, N.Y.

[73] Assignee: Ail Systems, Inc., Deer Park, N.Y.

[21] Appl. No.: 749,254

[22] Filed: Aug. 26, 1991

[51] Int. Cl.[5] .............................................. H03B 5/00
[52] U.S. Cl. ................................ 331/96; 331/107 DP
[58] Field of Search ............... 331/96, 107 R, 107 DP, 331/107 SL

[56] References Cited

U.S. PATENT DOCUMENTS 4,609,883  9/1986  Mizumura et al. ................... 331/96
4,871,983  10/1989 Graycar ................................ 331/96
4,922,211  5/1990  Otremba et al. .................. 331/96 X

OTHER PUBLICATIONS

*Dielectric Resonators,* "Simple Models; Filters", by Darko Kajfez and Pierre Guillon (1986).
*Microwave Receivers and Related Components,* "Transmission Lines", by James Tsui, The United States Air Force Avionics Laboratory, Wright-Patterson Air Force Base, pp. 183-215 (1983).

*Primary Examiner*—Robert J. Pascal
*Attorney, Agent, or Firm*—Hoffmann & Baron

[57] ABSTRACT

A Q enhanced dielectric resonator circuit includes a metal enclosure having interior walls defining a chamber. Secured to at least two interior walls is a dielectric substrate. Flatly mounted to at least one side of the dielectric substrate is a substrate stripline. A dielectric resonator is secured to the dielectric substrate at a selected distance from the substrate stripline. The dielectric substrate is positioned a sufficient distance from a ground plane such that the magnetic field lines of the dielectric resonator do not significantly interact with the ground plane. The dielectric resonator is also positioned such that there is substantial coupling of the magnetic field lines of the dielectric resonator with the magnetic field lines of the substrate stripline.

6 Claims, 6 Drawing Sheets

Q ENHANCED DIELECTRIC RESONATOR CIRCUIT

BACKGROUND OF THE INVENTION

1. Field Of The Invention

This invention relates to dielectric resonator oscillator and filter circuits and the like, and more particularly relates to a dielectric resonator oscillator circuit in which the intrinsic Q value of the dielectric resonator is significantly maintained after integration into an electrical circuit.

2. Description Of The Prior Art

Dielectric resonator oscillators are a class of stable microwave oscillators that are frequently used in radar and communication systems. Dielectric resonators are often utilized in oscillator circuits because of an intrinsically high Q value and excellent stability over broad temperature ranges. These characteristics allow an oscillator employing a dielectric resonator to have excellent frequency stability with only a small amount of phase noise over a wide range of environmental conditions. The Q value is defined as the ratio between the energy stored per cycle to the energy dissipated per cycle.

Dielectric resonators are usually made of a ceramic type material having a high dielectric constant ($\epsilon = 30$ to 40) and a low dissipative loss. These characteristics allow the dielectric resonator to store energy with relatively little internal energy dissipation. This corresponds to a high Q value for the dielectric resonator.

Every dielectric resonator has an intrinsic Q value which is its maximum Q value. However, this intrinsic Q value may decrease depending upon how the dielectric resonator is integrated in an electrical circuit. If the value of Q remains high even after integration into an electrical circuit, the dielectric resonator will have a significant frequency stabilization effect on the performance of the circuit. As the Q value decreases, the frequency stabilization effect will also decrease. It is known that oscillator output phase noise has the characteristic of changing in the relation $1/Q^2$. In other words, as the value of Q decreases the amount of associated output noise increases. In the case of a receiver local oscillator, the increased output noise can degrade the sensitivity of the receiver. When a dielectric resonator is employed in an oscillator circuit, it is imperative to integrate the dielectric resonator in a manner that does not significantly degrade the intrinsic Q value of the dielectric resonator so that a signal with low output noise can be generated.

Various printed transmission line mediums have been utilized with dielectric resonators in oscillator applications where a high degree of frequency stability (i.e. a high Q value) is required. In order to achieve the amount of magnetic field coupling required for oscillator performance, the dielectric resonator must be in relative close proximity to a transmission line of the oscillator circuit. FIG. 1 illustrates the traditional positioning of a dielectric resonator 100 and a printed microstrip transmission line 110. It is known to place the microstrip-dielectric resonator assembly in a metal enclosure 120 in order to reduce radiation losses and to thereby prevent an associated decrease in resonator Q value. In order to achieve sufficient magnetic field coupling, the dielectric resonator 100 should be positioned in relative close proximity to the microstrip transmission line 110. However, positioning the dielectric resonator 100 close to the microstrip transmission line 110 requires the resonator to be close to the ground plane 130 which causes the Q value of the resonator to significantly decrease.

Microstrip has traditionally been the most commonly used printed transmission line medium in dielectric resonator oscillators. However, microstrip and other commonly used transmission line mediums such as sandwich line, microguide, coplanar line and slot line have characteristics that cause degradation of the dielectric resonator Q value when used with a dielectric resonator. For example, when a dielectric resonator is used with microstrip, proper mutual magnetic field coupling is obtained when the resonator is in relative close proximity (approximately 0.01 to 0.02 inches) to the microstrip transmission line. But, since the dielectric resonator must be close to the microstrip transmission line, it will also be close to the ground plane and detrimental magnetic coupling between the dielectric resonator and the ground plane will result. The coupling of the dielectric resonator magnetic field with the ground plane causes dissipative loss from the dielectric resonator to the ground plane. This coupling significantly degrades the dielectric resonator Q value. It is known that the magnetic field coupling can cause a Q value reduction of approximately 50% for a dielectric resonator with an intrinsic Q value of 4500 at 22 GHz. As a result of the decrease in resonator Q value caused by the close proximity of the dielectric resonator to the transmission line ground plane, the full frequency stabilization effect of the dielectric resonator cannot be realized.

In an attempt to increase the Q value of the dielectric resonator, it is known to elevate the dielectric resonator above the microstrip substrate to maintain a sufficient distance between the dielectric resonator and the ground plane. FIG. 2 shows a dielectric resonator elevated above both a dielectric substrate 210 and microstrip transmission line 220 by a quartz spacer 230. This technique is commonly used to reduce dissipative losses due to the proximity of the ground plane and increase the Q value of the dielectric resonator 200. However, elevating the dielectric resonator a fixed distance above the dielectric substrate 210 and the microstrip transmission line 220 has the detrimental affect of decreasing the amount of magnetic field coupling between the resonator 200 and the microstrip transmission line 220. In order for an oscillator to operate efficiently, a significant amount of magnetic field line coupling is required.

If the dimensions of the metal enclosure (see FIG. 1) remain constant and the dielectric resonator is elevated above the microstrip substrate, the dielectric resonator will be closer to the top wall of the metal enclosure. The same effect is achieved if the top wall of the metal enclosure is brought closer to a stationary dielectric resonator. FIG. 3B illustrates what may occur to resonant frequency as the top wall of a metal enclosure 340, shown in FIG. 3A, is brought closer to the top of a stationary 22 GHz dielectric resonator. The resonator 300, shown in FIG. 3A, is located on top of a 0.10 inch quartz microstrip substrate 310 which has an integral ground plane 320. In addition, the quartz substrate is mounted on a 0.05 inch metal carrier 330 to provide rigidity. The dielectric resonator 300 is 0.12 inches in diameter and 0.048 inches in thickness. FIG. 3B shows an increasing resonator frequency as the top wall of the metal enclosure 340 is brought closer to the dielectric resonator 300. For example, when the top wall is 0.035 inches from the dielectric resonator, the resonator frequency is increased by 160 MHz as compared to when the top wall is more than 0.11 inches from the dielectric resonator. It is known that a reduction in distance from the substrate ground plane to the bottom of the resonator will have a similar but more significant affect on resonator frequency and resonator Q value.

A substrate cannot have unlimited thickness because the propagation characteristics of transmission lines are sensitive to the thickness of the substrate. In order to obtain the appropriate circuit impedance levels required for an oscillator circuit, typically at 22 GHz, a quartz substrate of 0.01 inches is used. However as previously stated, integration of a dielectric resonator with a microstrip line incurs an unavoidable decrease in Q value when the dielectric resonator is in close proximity to the substrate ground plane.

FIG. 4 shows an arrangement for the mechanical tuning of an H band dielectric resonator 400 utilizing a flat metal tuner plate 410. The thickness of the substrate 420 is 0.01 inches and its dielectric constant is 2.54. Movement of the flat metal tuner plate 410 has the same affect as displacing the entire top wall of the enclosure.

FIG. 5 illustrates the effect of displacing the flat metal tuner plate 410 shown in FIG. 4 in relation to the dielectric resonator 400. FIG. 5 shows how resonator frequency increases and resonator Q value decreases as the spacing between the top of the resonator and the tuner plate is reduced. For example, the Q value decreases from 8149 with a 6 mm (0.236 inch) space to a value of 3265 when there is almost no gap between the tuner plate 410 and the dielectric resonator 400. This reduction in resonator Q value corresponds to a decrease by a factor of approximately 2.5. FIG. 5 also illustrates a corresponding change in resonator frequency from 7.56 GHz to 9.08 GHz as the space between the tuner plate and the dielectric resonator is reduced from 6 mm to 0 mm. It is known that a similar relationship between resonator Q value and resonator frequency exists as the distance from the substrate ground plane to the bottom of the dielectric resonator decreases. In other words, the resonator frequency and resonator Q value may be dependent upon the thickness of the substrate.

Utilizing the configuration of FIG. 4, it can be inferred from FIG. 5 that a ground plane to resonator spacing of 0.01 inches can produce a significant decrease in resonator Q (factor of 2) and an increase (9.1%) in resonator frequency. This represents significant unwanted degradation of the resonator Q value.

It should be noted that there are also electronic filters that utilize dielectric resonators coupled to microstrips which undergo a significant degradation in resonator Q value due to the close proximity of the dielectric resonator to the transmission line ground plane.

OBJECTS AND SUMMARY OF THE INVENTION

It is an object of the present invention to provide an apparatus which substantially maintains the intrinsic Q value of a dielectric resonator when it is integrated with a particular and known transmission line medium.

It is another object of the present invention to provide a means which substantially eliminates the degradation of resonator Q value by utilizing a suspended stripline as the transmission line medium.

If is yet another object of the present invention to provide a means which substantially eliminates the degradation of the resonator Q value and permits the use of various transmission line mediums to form a microwave or millimeter wave printed oscillator circuit.

It is an object of the present invention to provide a larger degree of magnetic field line coupling between a dielectric resonator and a suspended stripline printed transmission line than previously available with other printed transmission line mediums while significantly maintaining the intrinsic Q value of the dielectric resonator.

It is still a further object of the present invention to provide a dielectric resonator circuit which utilizes a smaller dielectric resonator for a given frequency in order to reduce the size of the printed oscillator circuit.

It is yet a further object of the present invention to provide a means to substantially maintain the intrinsic Q value of a dielectric resonator when it is coupled to a transmission line of an electronic filter.

It is still a further object of the present invention to provide a means to substantially maintain the intrinsic Q value of a dielectric resonator which overcomes the inherent disadvantages of known dielectric resonator circuit integration techniques.

In accordance with one form of the present invention, a Q enhanced dielectric resonator oscillator circuit includes a metal enclosure, a dielectric substrate, a suspended substrate stripline and a dielectric resonator.

More specifically, the Q enhanced dielectric resonator oscillator circuit includes a metal enclosure forming a chamber which is defined by the interior walls of the metal enclosure. In addition, at least one of the interior walls of the metal enclosure functions as a ground plane. Located within the metal enclosure and secured to at least two of the interior walls of the metal enclosure is a dielectric substrate. The dielectric substrate has both a top surface and a bottom surface that are substantially parallel to the ground plane. A first cavity within the metal enclosure is defined by the top surface of the dielectric substrate and the proximate interior walls of the metal enclosure. Similarly, a second cavity within the metal enclosure is defined by the bottom surface of the dielectric substrate and the proximate interior walls of the metal enclosure. Preferably, a balanced type suspended substrate stripline is utilized wherein the dielectric substrate is positioned midway between the top and bottom walls of the metal enclosure.

The Q enhanced dielectric resonator oscillator circuit also includes a suspended substrate stripline transmission line which when propagating energy generates an electromagnetic field that is defined by substrate stripline magnetic and electric field lines. The substrate stripline is flatly mounted to at least one side of the dielectric substrate. Secured to dielectric substrate on the same side or sides as the substrate stripline is a dielectric resonator generating a magnetic field defined by dielectric resonator magnetic field lines. The dielectric substrate is positioned within the metal enclosure a sufficient distance from the metal walls which constitute a ground plane such that, when the dielectric resonator is secured to the dielectric substrate, the dielectric resonator magnetic field lines are substantially isolated from the ground plane. In addition, the dielectric resonator is also positioned such that there is a substantial amount of magnetic field line coupling between the dielectric resonator and the substrate stripline.

A preferred form of the Q enhanced dielectric resonator oscillator circuit as well as other embodiments, objects, features and advantages of this invention, will become apparent from the following detailed description of the preferred embodiments, which are to be read in connection with the accompanying drawings.

DETAILED DESCRIPTION OF THE PREFERRED EMBODIMENTS

Figure 1:
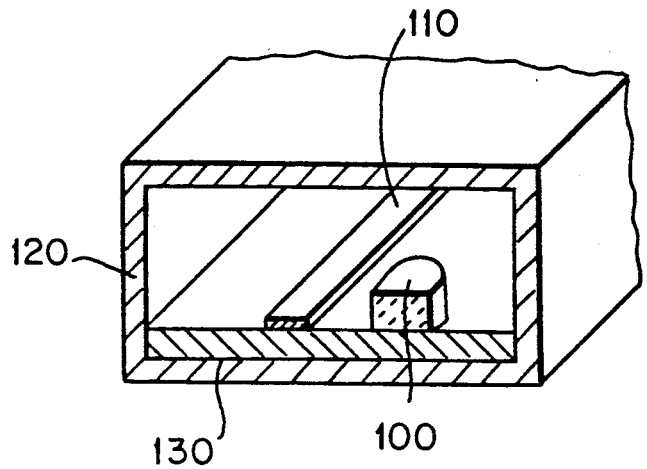
FIG. 1 is a transverse cross-sectional view of a conventional resonator arrangement illustrating the traditional positioning of a microstrip printed transmission line and a cylindrical dielectric resonator.
Figure 2:
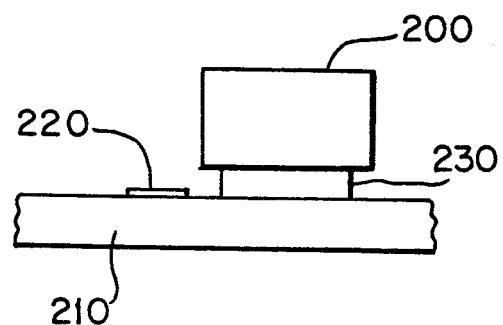
FIG. 2 is a side view of a dielectric resonator elevated from the microstrip substrate by a quartz spacer.
Figure 3A:
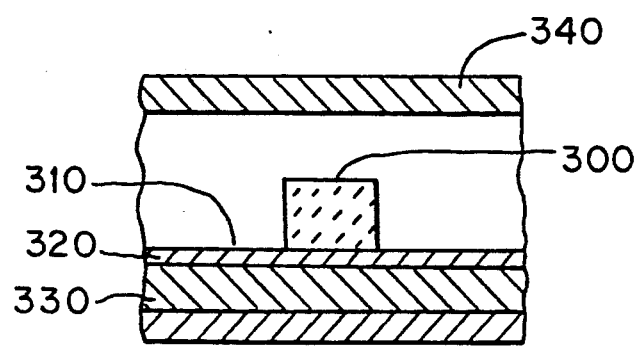
FIG. 3A is a transverse cross-sectional view of a dielectric resonator located on top of a 0.01 inch quartz microstrip substrate.
Figure 3B:
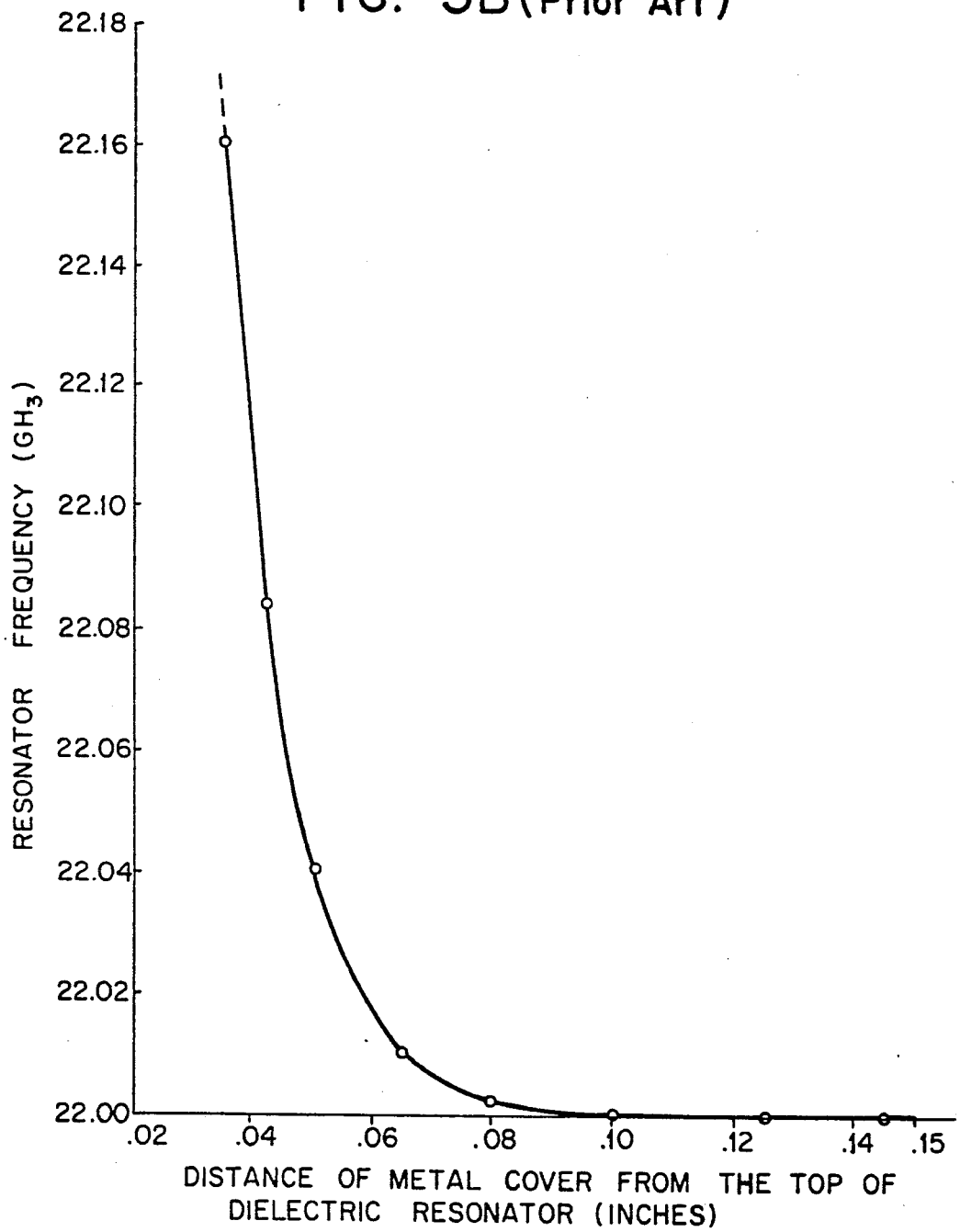
FIG. 3B is a graph showing the affect on resonant frequency as the top wall of a metal enclosure of FIG. 3A is brought closer to the top of a 22 GHz dielectric resonator.
Figure 4:
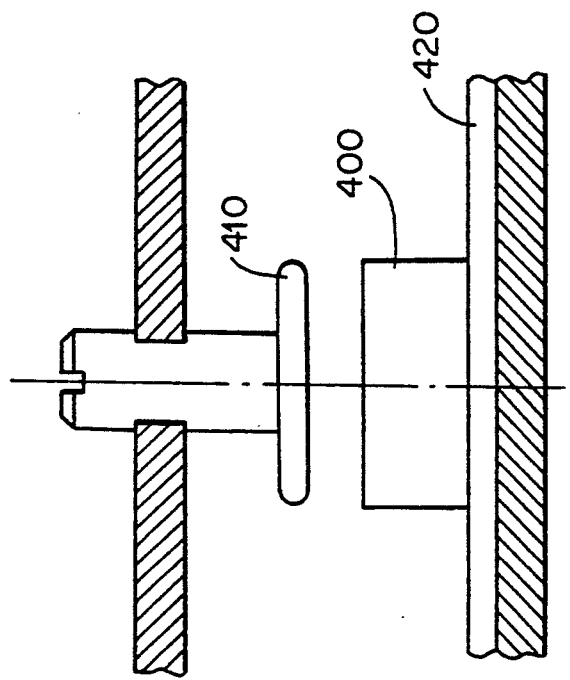
FIG. 4 is a transverse cross-sectional view of an arrangement for the mechanical tuning of an H-band dielectric resonator.
Figure 5:
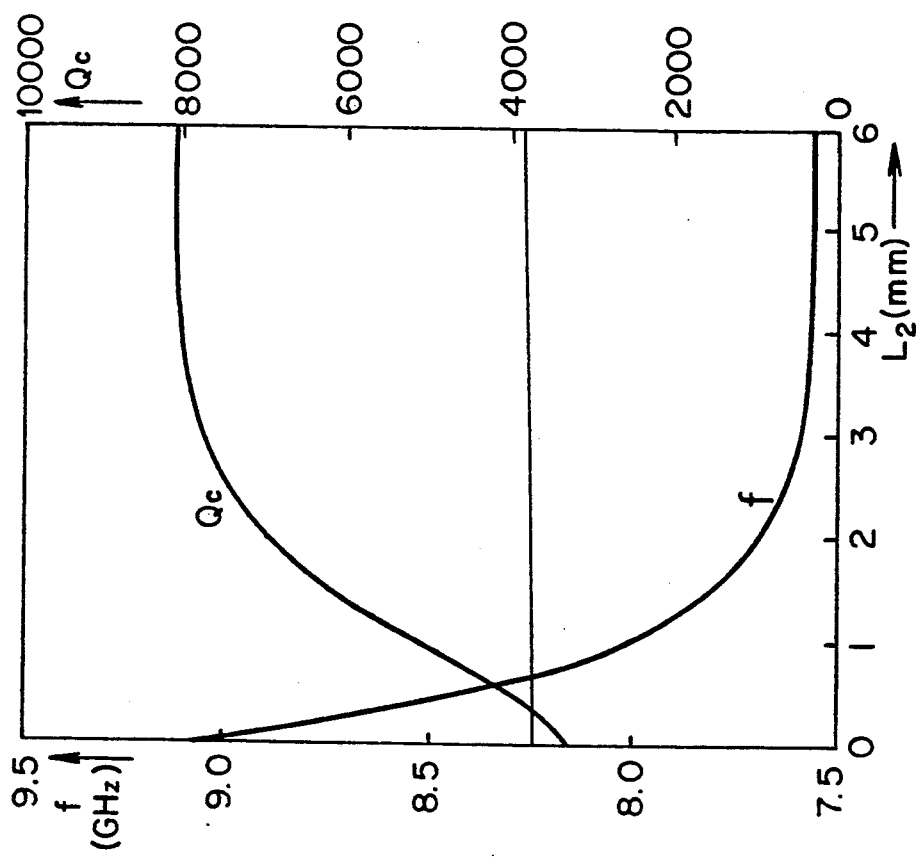
FIG. 5 is a graph showing the effect on resonator frequency and resonator Q value as the spacing between a flat tuner plate and the top of the dielectric resonator shown in FIG. 4 is varied.
Figure 6:
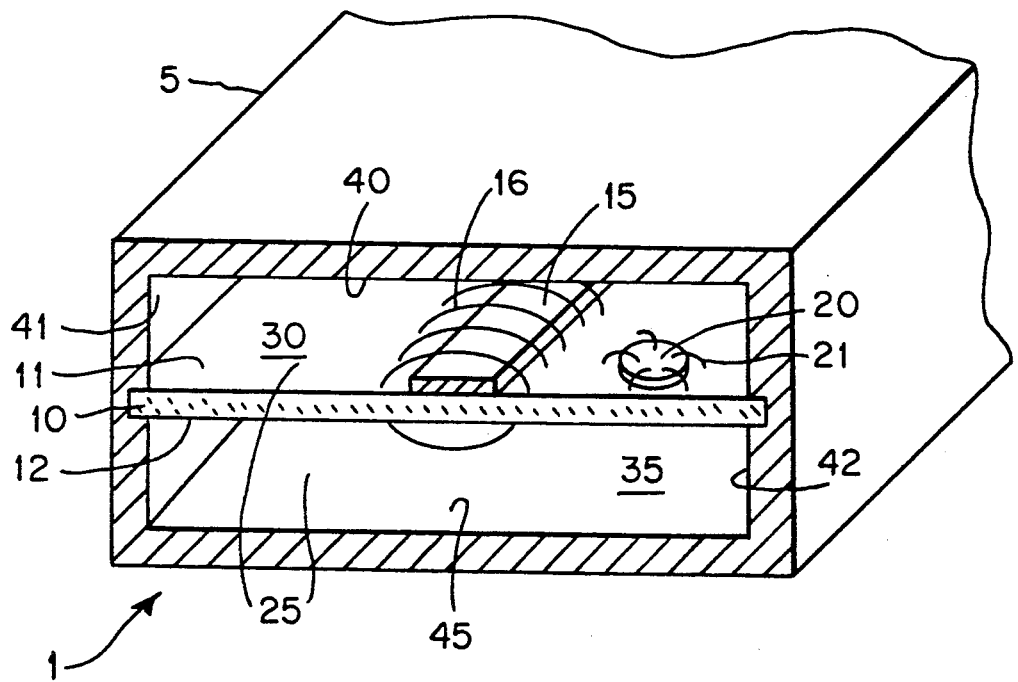
FIG. 6 is a transverse cross-sectional view of a dielectric resonator coupled to a single registry type suspended substrate stripline formed in accordance with the present invention.

Referring now to FIG. 6 of the drawings, a preferred form of a Q-enhanced dielectric resonator oscillator circuit 1 constructed in accordance with the present invention will now be described. The Q enhanced dielectric resonator oscillator circuit 1 is designed to significantly maintain the intrinsic Q value of a dielectric resonator even when it is integrated in an electrical circuit. The device of FIG. 6 can be referred to as a single registry type suspended substrate stripline.

The Q enhanced dielectric resonator oscillator circuit 1 shown in FIG. 6 basically includes a metal enclosure 5, a dielectric substrate 10, a substrate stripline 15 and a dielectric resonator 20.

The Q enhanced dielectric resonator oscillator circuit 1 preferably includes a metal enclosure 5 having a chamber 25 defined by interior walls of the metal enclosure. It is preferred that the interior walls (for example, bottom wall 45) of the metal enclosure 5 function as a ground plane. The metal enclosure 5 serves to suppress radiation and reduce coupling with neighboring electrical circuits.

Located within the chamber 25 of the metal enclosure 5 is a dielectric substrate 10 that is secured to at least two interior walls within the chamber 25 of the metal enclosure 5. The dielectric substrate 10 has a top surface !1 and a bottom surface 12 which are both substantially parallel to the ground plane interior wall of the metal enclosure 5. Preferably, the dielectric substrate is located at the midheight plane of the metal enclosure. Included within the metal enclosure 5 is a first cavity 30 above the top surface of the dielectric substrate. The first cavity 30 is defined by the top surface of the dielectric substrate and the proximate interior walls of the metal enclosure. The proximate interior walls of the metal enclosure include the interior wall 40 opposite the top surface of the dielectric substrate and the two side walls 41, 42 which are secured to and support the ends of the dielectric substrate 10. Additionally, the metal enclosure 5 has a second cavity 35 defined by the bottom surface of the dielectric substrate 10 and the proximate interior walls of the metal enclosure including the bottom interior wall 45 opposite the bottom surface of the dielectric substrate and the two side walls 41, 42 which are secured to and support the ends of the dielectric substrate 10. The first cavity 30 and second cavity 35 may be filled with a low dielectric constant material to provide rigidity appropriate to specific environmental requirements.

The cavity between the dielectric substrate and the ground plane interior wall of the metal enclosure can be large since most of the cross section of the cavity is occupied by air and the effective dielectric constant is only slightly greater than one. Accordingly, a large spacing can be provided between a dielectric resonator mounted on the dielectric substrate and the ground plane (metal enclosure) than can be realized with other transmission line media.

The dielectric substrate 10 can be either a soft or hard substrate. It has been found that Duroid ™ manufactured by Rogers Corporation and Epsilon ™ manufactured by 3M Corporation may be used as a soft dielectric substrate. Additionally, suitable hard dielectric substrates include ceramics (ex., aluminum oxide ceramic) and quartz.

Preferably mounted on and included with the dielectric substrate 10 is a metallic conductor herein referred to as a substrate stripline 15. The substrate stripline 15 has a magnetic field that is defined by dielectric substrate magnetic field lines 16.

Secured to the dielectric substrate 10 is a dielectric resonator 20. The dielectric resonator may have many shapes. However, in the preferred embodiment, the dielectric resonator is in the shape of a circular disk. The dielectric resonator 20 has a magnetic field defined by dielectric resonator magnetic field lines 21.

The position of the dielectric substrate 10 in relation to the metal enclosure 5 is chosen so that the dielectric resonator magnetic field lines 21 do not significantly intersect the interior wall ground plane when the dielectric resonator 20 is secured to the dielectric substrate 10. The dielectric resonator 20 is selectively positioned on the dielectric substrate 10 such that there is a substantial and significant amount of magnetic field line coupling between the dielectric resonator magnetic field and the substrate stripline magnetic field. This arrangement of placing the dielectric resonator 20 on the surface of the dielectric substrate 10 allows adjustment of the amount of magnetic field coupling taking place between the dielectric resonator and the substrate stripline.

Figure 7:
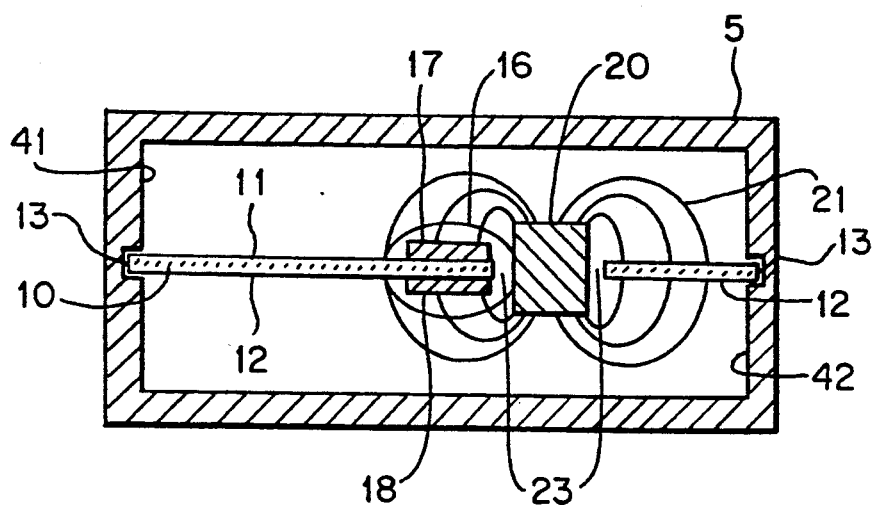
FIG. 7 is a cross-sectional view of a dielectric resonator coupled to a double registry type suspended substrate stripline formed in accordance with another form of the present invention.

Referring now to FIG. 7 of the drawings, an alternative form of the Q enhanced dielectric resonator oscillator circuit is illustrated. Specifically, the dielectric substrate 10 contains an opening 23 whose greater length extends perpendicularly to the longitudinal axis of the suspended substrate stripline and through both the top and bottom surface of the dielectric substrate 10. The opening 23 is designed to receive a circular disk-shaped dielectric resonator. The opening is dimensioned to allow the orientation of the dielectric resonator 20 to the dielectric substrate 10. More specifically, the circular disk-shaped resonator has a diameter which is at most equal to the transverse width of the slot so that the resonator can be moved closer to or farther away from the microstrip before it is secured in a position which provides the desired coupling between the resonator and the microstrip. Preferably, the height of the dielectric resonator 20 is greater than the thickness of the dielectric substrate 10 such that the top and bottom of the dielectric resonator 20 protrude from the top and bottom surfaces of the dielectric substrate 10. The positioning of the dielectric resonator through a slot in the dielectric substrate can be used with both the single registry type suspended substrate stripline and the double registry type suspended substrate stripline.

Also included in the alternative form of the Q enhanced dielectric resonator oscillator circuit is at least two substrate striplines mounted to both the top and bottom surface of the dielectric substrate 10. Preferably, a first substrate stripline 17 is mounted to the top surface of the dielectric substrate 10 and a second substrate stripline 18 is mounted to the bottom surface of the dielectric 10. In the preferred embodiment, the first and second substrate striplines have their edges substantially aligned so that they are substantially parallel. The device of FIG. 7 may be referred to as a double registry type suspended substrate stripline.

In a preferred embodiment, the two interior walls 41, 42 that secure the dielectric substrate 10 have rectangular grooves 13 that are substantially equidistant from corresponding adjoining walls 40, 45. Preferably, the rectangular grooves 13 are located at the approximate midpoint of the interior walls of the metal enclosure 5. The edges of the dielectric substrate 10 are inserted within the rectangular grooves 13 of the interior walls to provide a secure mounting for the dielectric substrate 10.

Figure 8:
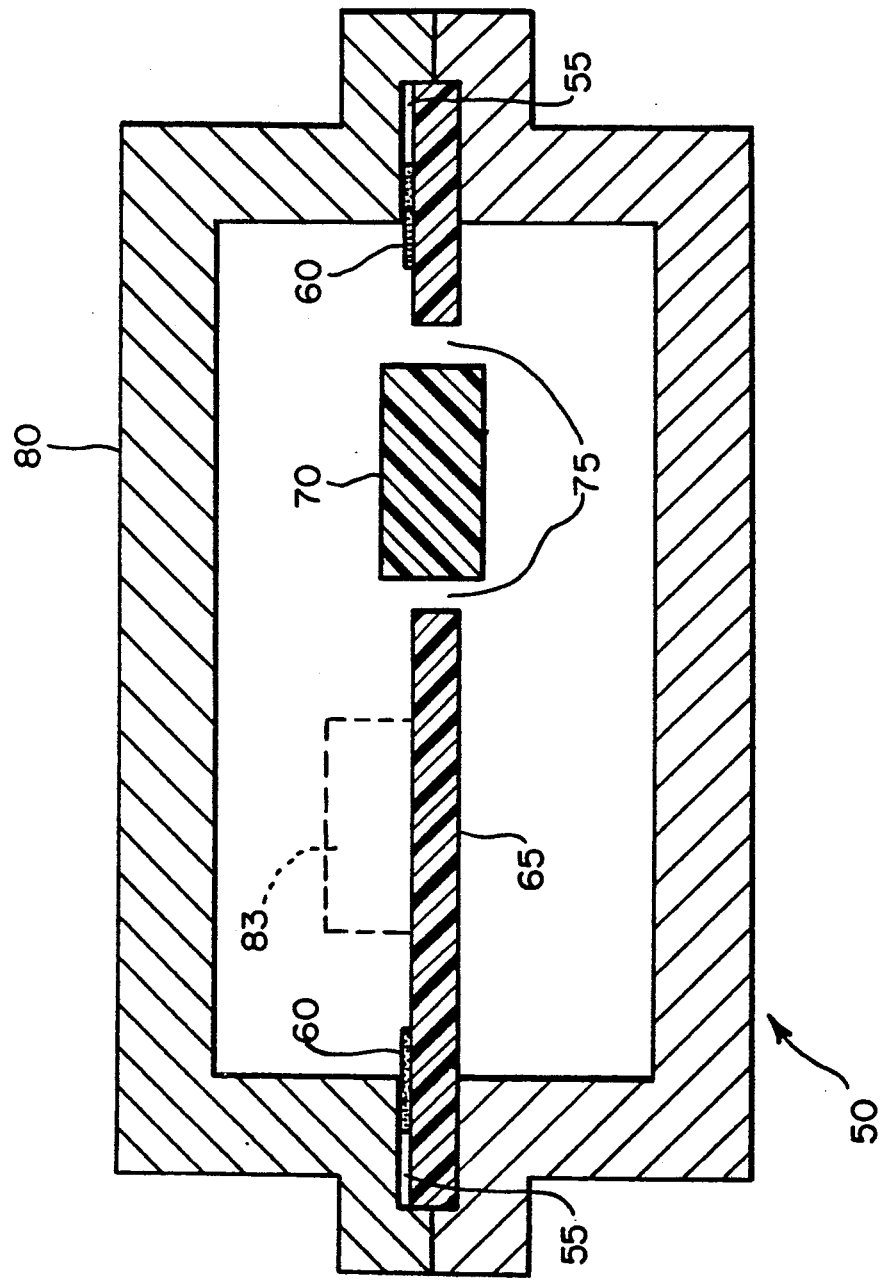
FIG. 8 is a cross-sectional view of a high frequency dielectric resonator coupled to a suspended substrate stripline surrounded by a metal enclosure.

Referring now to FIG. 8, a configuration of a 22 GHz dielectric resonator mounted on a suspended substrate stripline in a metallic enclosure 50 is shown. Waveguide mode propagation is inhibited by sizing the width of the rectangular grooves 55 to be one-quarter wavelength at the operating frequency (for example, 22 GHz). In addition, waveguide mode propagation may be inhibited by the use of a resistive film 60 on the dielectric substrate 65 in the vicinity of the rectangular grooves 55. The dielectric resonator 70 is 0.112 inch in diameter and 0.0445 inch in thickness for a 22 GHz resonant frequency.

When the dielectric resonator 70 is supported by the dielectric substrate 65 within the slot opening 80 in the symmetrical manner shown in FIG. 8, the distance from the top surface of the dielectric resonator 70 to the metal enclosure 80 is the same as the distance from the bottom surface of the dielectric resonator to the metal enclosure 80. Each distance from the dielectric resonator to the metal enclosure is 0.090 inches. Furthermore, the distance from the edge of the dielectric resonator 70 to the proximate side wall of the metal enclosure is 0.077 inches. These spacings are sufficiently large such that the metal walls will have an insignificant affect on the dielectric resonator Q value and on resonator frequency. Therefore, the intrinsic Q value of the dielectric resonator can be realized.

The circuit configuration of the present invention using suspended stripline as the transmission line medium for coupling to a dielectric resonator will enable a significantly higher Q value to be realized as compared to conventional circuit configurations using other transmission line mediums. The Q value improvement realized with a suspended stripline coupling is at least a factor of two better than with microstrip coupling. The improvement is a direct result of the large air space between the transmission line ground plane and the dielectric resonator which eliminates dissipative loss that would degrade the dielectric resonators intrinsic Q value of the dielectric resonator.

In addition to the enhanced Q value, the above described suspended stripline arrangement will provide greater coupling between the dielectric resonator and the substrate stripline than achieved by coupling a dielectric resonator to a microstrip line. A larger coupling factor yields improved oscillator performance. The increased coupling factor is a result of the more favorable spatial distribution of the dielectric resonator magnetic field, the absence of a closely spaced ground plane and the symmetrical placement of the resonator with respect to the stripline conductor. The slot opening arrangement as shown in FIG. 8 and as previously described can be used so that the dielectric resonator position can be adjusted for optimum oscillator performance.

An alternate mounting of the dielectric resonator is shown by the dotted lines 83 in FIG. 8. This arrangement provides more flexibility in positioning the resonator for optimum oscillator performance. The alternative location for mounting the dielectric resonator of FIG. 8 includes securing the resonator so that the bottom surface of the resonator is substantially parallel with the top surface of the substrate. Optimum oscillator performance can be achieved by selectively positioning the resonator on the surface of the substrate or by laterally positioning the resonator in the slot and raising or lowering the resonator a sufficient distance in the slot opening to achieve the desired result.

Figure 9:
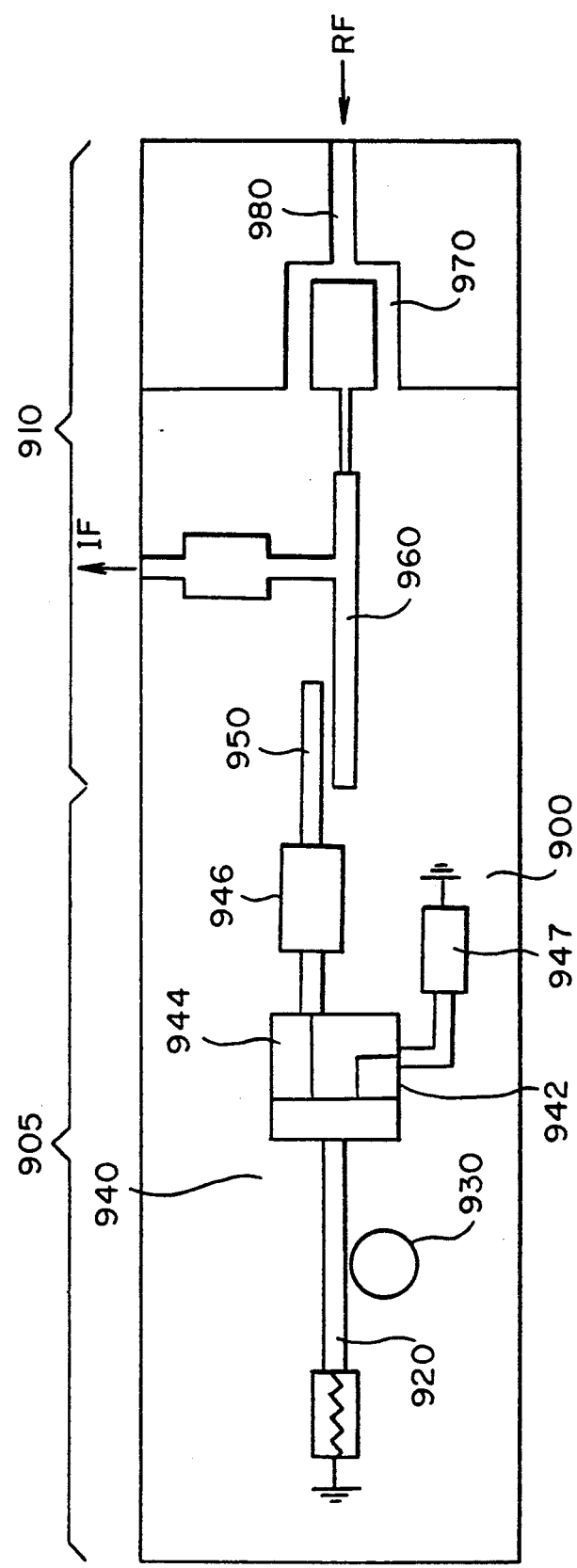
FIG. 9 is a top plan view of an integrated dielectric resonator FET local oscillator and mixer with a suspended substrate dielectric resonator section.

Referring now to FIG. 9 of the drawings, an integrated dielectric resonator FET local oscillator and mixer with a suspended substrate dielectric resonator section and printed mixed transmission mediums is shown. This is an illustrative example of the use of suspended stripline for Q enhancing a dielectric resonator in a printed FET oscillator. The dielectric resonator FET local oscillator section 905 is shown on a common dielectric substrate 900 integrated with a printed mixer section 910 to illustrate how a variety of printed transmission lines can be used together. Optimum transmission mediums may be chosen for the various portions of the mixer section 910 and the local oscillator section 905 of FIG. 9. For example, suspended stripline 920 is shown with the dielectric resonator 930 in order to realize the intrinsic Q value of the dielectric resonator.

As shown in FIG. 9, the dielectric resonator 930 is mounted in the suspended substrate stripline gate section 940 of the FET oscillator. This section is integrated with the source 942 and drain 944 sections of the oscillator in microstrip. Also shown are the FET drain resistor 946 and the FET source resistor 947. The output of the oscillator is directly integrated with the mixer section 910 that utilizes microstrip 950 and 960, coplanar line 970 and slot line 980 transmission mediums.

The propagation of waveguide modes above a certain cutoff frequency is determined by the channel width of the transmission medium. This sets an upper limit to the operating frequency. The channel width is normally less than one half wavelength at the operating frequency. The channel width criteria also sets the size of the printed circuit and the size of the dielectric resonator that can be utilized without compromising immunity from unwanted waveguide mode propagation. A suspended substrate stripline results in the use of a small dielectric resonator for a given frequency as compared with other transmission mediums.

In an alternative embodiment, the means disclosed for providing a Q enhanced dielectric resonator oscillator circuit may also be applied to enhance the Q values of various types of dielectric resonator filter circuits. Filters are currently available that use dielectric resonators coupled to microstrip. The use of suspended stripline rather than microstrip for a filter function would produce higher dielectric resonator Q values which translates to more favorable filter performance.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

I claim:

1. A Q enhanced dielectric resonator oscillator circuit comprising:
    a metal enclosure having interior walls defining a chamber, at least one of the interior walls functioning as a ground plane;
    a dielectric substrate being secured to at least two interior walls within the chamber of the metal enclosure, the dielectric substrate having a top surface and a bottom surface substantially parallel to the interior wall which functions as the ground plane, the top surface of the dielectric substrate and the proximate interior walls of the metal enclosure defining a first cavity, the bottom surface of the dielectric substrate and the proximate interior walls of the metal enclosure defining a second cavity;
    at least one substrate stripline which when propagating energy generates a magnetic field defined by magnetic field lines, the substrate stripline being flatly mounted on one of the top and bottom surfaces of the dielectric substrate; and
    a dielectric resonator generating a magnetic field defined by magnetic field lines, the dielectric resonator being secured to the dielectric substrate, the dielectric resonator being positioned a sufficient distance from the ground plane interior wall such that the magnetic field lines of the dielectric resonator are substantially isolated from the ground plane interior wall, the dielectric resonator also being positioned such that there is substantial coupling of the magnetic field of the dielectric resonator with the magnetic field of the substrate stripline.

2. A Q enhanced dielectric resonator circuit in accordance with claim 1 wherein the dielectric substrate has an aperture formed therethrough, the aperture passing entirely through the top surface and bottom surface of the dielectric substrate, the transverse width of the aperture being at least equal to the transverse width of the dielectric resonator, the aperture allowing the dielectric resonator to be adjusted in position within the aperture.

3. A Q enhanced dielectric resonator oscillator circuit in accordance with claim 2 wherein the Q enhanced dielectric resonator oscillator circuit has at least a first substrate stripline being mounted on the top surface of the dielectric substrate and the second substrate stripline being mounted on the bottom surface of the dielectric stripline, and wherein the first substrate stripline mounted on the top surface and the second substrate stripline mounted on the bottom surface have edges which are substantially aligned.

4. A Q enhanced dielectric resonator oscillator circuit in accordance with claim 1 wherein the dielectric resonator is mounted on one of the top surface and the bottom surface of the dielectric substrate, the dielectric resonator being positioned with respect to the substrate stripline such that the magnetic field of the dielectric resonator is substantially coupled with the magnetic field of the substrate stripline.

5. The Q enhanced dielectric resonator circuit in accordance with claim 1 which further comprises a low dielectric constant material, the low dielectric material being situated to substantially fill the first and second cavities.

6. A Q enhanced dielectric resonator circuit in accordance with claim 1 wherein each of the two interior walls to which the dielectric substrate is secured has formed therein a groove, the grooves being substantially equidistant from corresponding adjoining interior walls; and wherein
    the dielectric substrate is secured within the chamber of the metal enclosure by insertion of a portion of the dielectric substrate within the grooves of corresponding interior walls.

* * * * *